United States Patent
Tu et al.

[11] Patent Number: 6,107,139
[45] Date of Patent: Aug. 22, 2000

[54] METHOD FOR MAKING A MUSHROOM SHAPED DRAM CAPACITOR

[75] Inventors: Yeur-Luen Tu, Taichung; Chine-Gie Lou, Hsinchu-Hsien, both of Taiwan

[73] Assignee: Worldwide Semiconductor Manufacturing Corporation, Hsinchu, Taiwan

[21] Appl. No.: 09/118,170

[22] Filed: Jul. 17, 1998

[51] Int. Cl.[7] .................. H01L 21/8242; H01L 21/44; H01L 27/108

[52] U.S. Cl. .................. 438/254; 438/666; 257/296; 257/300

[58] Field of Search .................. 438/253, 387, 438/389, 396, 397, 398, 254, 256, 400, 666, 657, 667; 257/296, 298, 300, 301

[56] References Cited

U.S. PATENT DOCUMENTS

| | | | |
|---|---|---|---|
| 5,643,819 | 7/1997 | Tseng | 438/396 |
| 5,759,890 | 6/1998 | Chao | 438/253 |
| 5,792,688 | 8/1998 | Tseng | 438/253 |
| 5,792,692 | 8/1998 | Li et al. | 438/253 |
| 5,849,617 | 12/1998 | Wu | 438/253 |
| 5,856,220 | 1/1999 | Wang et al. | 438/254 |
| 5,902,124 | 5/1999 | Hong | 438/255 |
| 5,926,719 | 7/1999 | Sung | 438/396 |
| 5,930,621 | 7/1999 | Kang et al. | 438/253 |
| 5,930,622 | 7/1999 | Wu | 438/253 |
| 5,994,197 | 10/1999 | Liao | 438/396 |
| 6,037,212 | 3/2000 | Chao | 438/253 |
| 6,051,463 | 4/2000 | Lee | 438/253 |

*Primary Examiner*—Chandra Chaudhari
*Assistant Examiner*—Brook Kebede
*Attorney, Agent, or Firm*—Blakely, Sokoloff, Taylor & Zafman LLP

[57] ABSTRACT

A method of forming a capacitor for a DRAM memory cell is disclosed. The method comprises the steps of forming a crown shaped capacitor being partially filled with oxide. Next, nitride spacers and polysilicon spacers are formed on the sides of crown capacitor. The remaining oxide is removed and then the oxide spacers are removed to leave a mushroom shaped bottom storage node. A dielectric is deposited and a top conductive node is deposited to complete the capacitor.

17 Claims, 5 Drawing Sheets

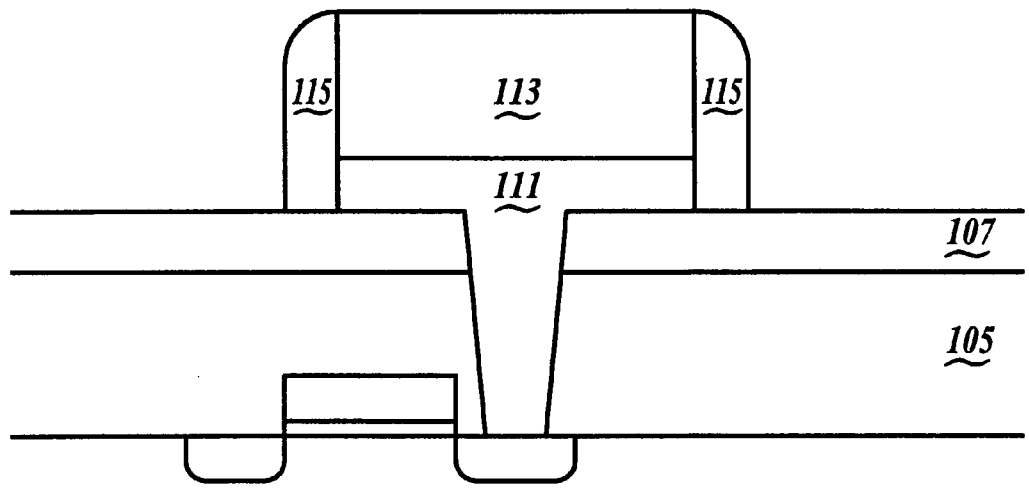
Fig. 3 *(PRIOR ART)*
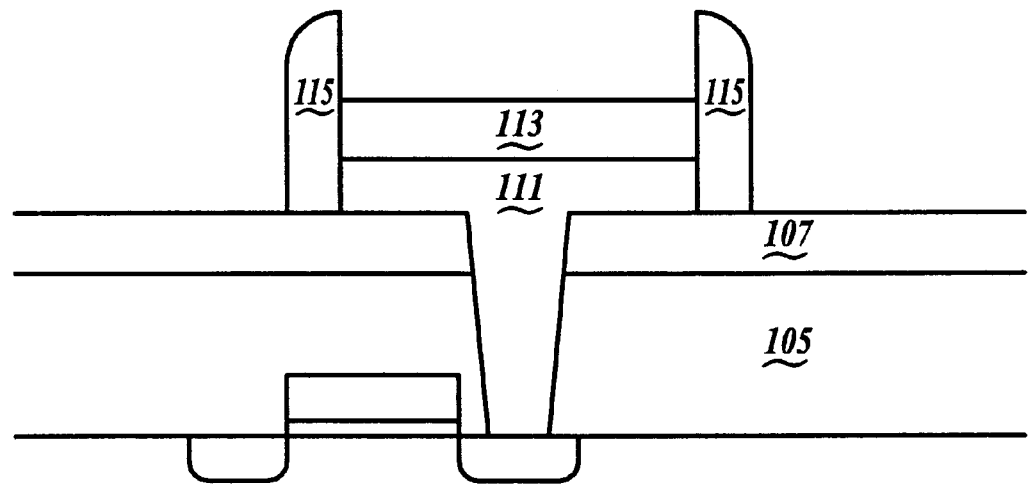
Fig. 4

METHOD FOR MAKING A MUSHROOM SHAPED DRAM CAPACITOR

TECHNICAL FIELD OF THE INVENTION

This invention relates to semiconductor memories, and more particularly, to an improved method for making a DRAM capacitor.

BACKGROUND OF THE INVENTION

It has been a recent trend in dynamic random access memory (DRAM) to increase the density of DRAM integrated circuits. However, as higher density DRAM cells are developed, the area available for capacitors that are used in the DRAM cells decreases. In order to decrease the area of capacitors while maintaining reliability standards, it is important to be able to maintain the capacitance of each capacitor while decreasing its footprint. Recently, capacitors having a three-dimensional structure have been suggested to increase cell capacitance. Such capacitors include, for example, double-stacked, fin-structured, cylindrical, spread-stacked, and box structured capacitors.

There is also a challenge to develop methods of manufacturing these capacitors that minimize the manufacturing costs and provide maximum process tolerance to maximize product yields. The present invention is directed to such an improved capacitor.

SUMMARY OF THE INVENTION

A method of forming a capacitor for a DRAM memory cell is disclosed. The method comprises the steps of: forming an interlayer dielectric; forming a nitride layer over said interlayer dielectric layer; forming a contact plug in a contact hole formed in said nitride layer and said interlayer dielectric; forming a first polysilicon layer over contact plug and said nitride layer; forming an oxide layer over said first polysilicon layer; patterning and etching said oxide layer and said first polysilicon layer to form an intermediate structure over said contact plug; forming first polysilicon spacers on the sides of said intermediate structure; removing a portion of said oxide layer of said intermediate structure so that the tops of said first polysilicon spacers are exposed; forming nitride spacers on the sides of said first polysilicon spacers, said nitride spacers not extending to the top of said first polysilicon spacers; forming second polysilicon spacers on said nitride spacers and said first polysilicon spacers; removing said oxide layer; removing said nitride spacers and said nitride layer; and forming a dielectric layer and a top conductive layer over the bottom storage node.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIGS. 1–3 are cross-sectional views of a semiconductor substrate illustrating some of the steps in forming a prior art crown shaped capacitor; and FIGS. 4–9 are cross-sectional views of a semiconductor substrate illustrating the steps of the present invention for forming a capacitor.

DETAILED DESCRIPTION OF THE PREFERRED EMBODIMENT

The present invention will be described in detail with reference to the accompanying drawings. The present invention provides a method of forming a capacitor that is commonly used in DRAM cells as the capacitor over bitline (COB).

Figure 1:
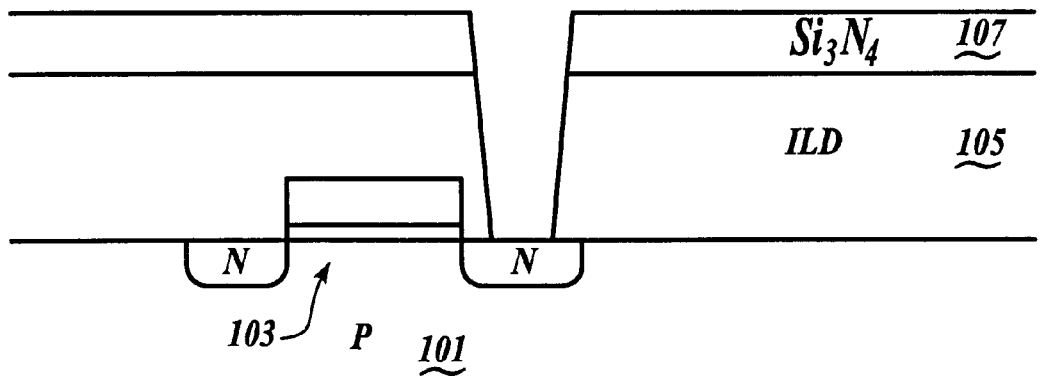

Turning to FIG. 1, using conventional techniques a semiconductor substrate 101 having formed thereon an access transistor 103 is shown. Formed atop the access transistor 103 is an interlayer dielectric (ILD) 105. The interlayer dielectric 105 is typically formed from combination layers of silicon dioxide, tetraethylorthosilicate (TEOS), or BPSG layers and serves as insulation and planarization. Then, a nitride layer 107, preferably $Si_3N_4$, is deposited over the ILD 105. Preferably, the nitride layer 107 is formed using CVD techniques and to a thickness of 1500–2000 angstroms.

Figure 2:
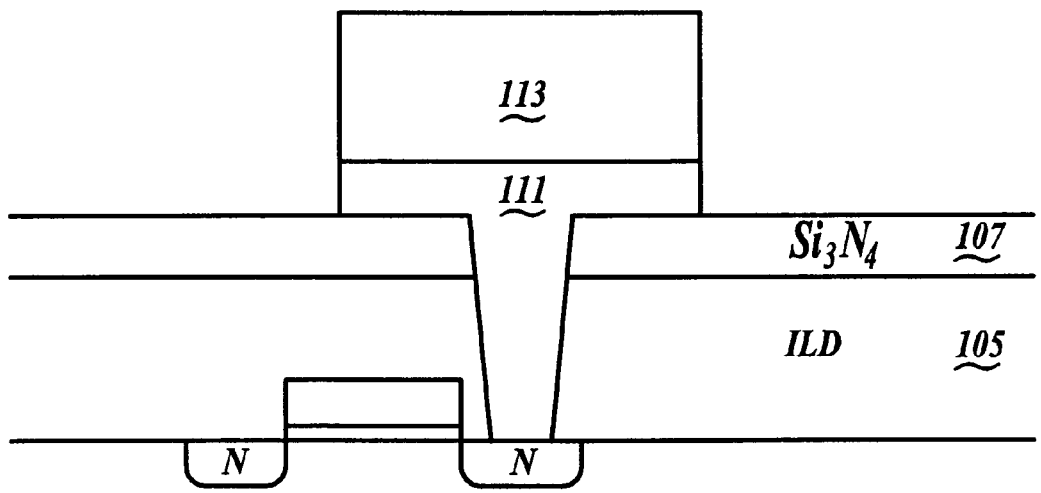

Still referring to FIG. 1, a contact hole is opened in the nitride layer 107 and ILD 105 by conventional patterning and etching techniques. Next, turning to FIG. 2, a first layer of in-situ doped polysilicon 111 is then formed using conventional CVD techniques to a thickness of 1000–2000 angstroms. The in-situ doped polysilicon 111 also fills the contact hole opened in the nitride layer.

An oxide layer 113 is then formed atop of the first polysilicon layer 107. Preferable, the oxide layer 113 is formed of tetraethylorthosilicate (TEOS) or borophosphosilicate glass (BPSG) using conventional methods. In the preferred embodiment, the oxide layer 113 is on the order of 4000–6000 angstroms thick. Then, the oxide layer 113 and first polysilicon layer 111 is patterned and etched to form the intermediate stack structure shown in FIG. 2.

Turning to FIG. 3, polysilicon sidewall spacers 115 are then formed on the sidewalls of the first polysilicon layer 111 and oxide layer 113. The polysilicon sidewall spacers 115 may be formed by depositing another layer of polysilicon to a thickness of 500–2000 angstroms and etching back the polysilicon using conventional techniques. The result is the prior art structure of FIG. 3.

Turning to FIG. 4, a wet dip oxide etch is performed to remove a portion of the oxide layer 113. Preferably, the wet dip oxide etch is performed using a dilute HF solution or a buffered oxide etch. Further, preferably, approximately 1000–2000 angstroms of the oxide layer 113 remains between the polysilicon sidewall spacers 115. Note that the nitride layer 107 acts as a barrier layer to the wet dip oxide etch.

Figure 5:
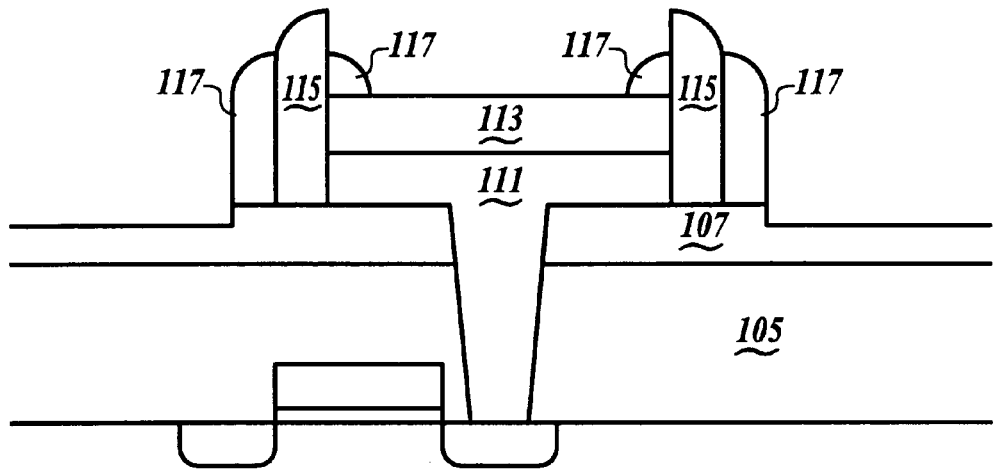

Turning to FIG. 5, a nitride layer (preferably $Si_3N_4$) is then formed over the structure to a thickness of about 500–2000 angstroms. This is followed by a conventional anisotropic etch to form nitride spacers 117. Over etching is applied to expose the tops (approximately 600–1500 angstroms) of the polysilicon sidewall spacers 115. The over etching will also consume a portion (approximately 600–1500 angstroms) of the nitride layer 107. Because it is important that a portion of the nitride layer 107 remain, the nitride layer 107 should be made of sufficient thickness.

Figure 6:
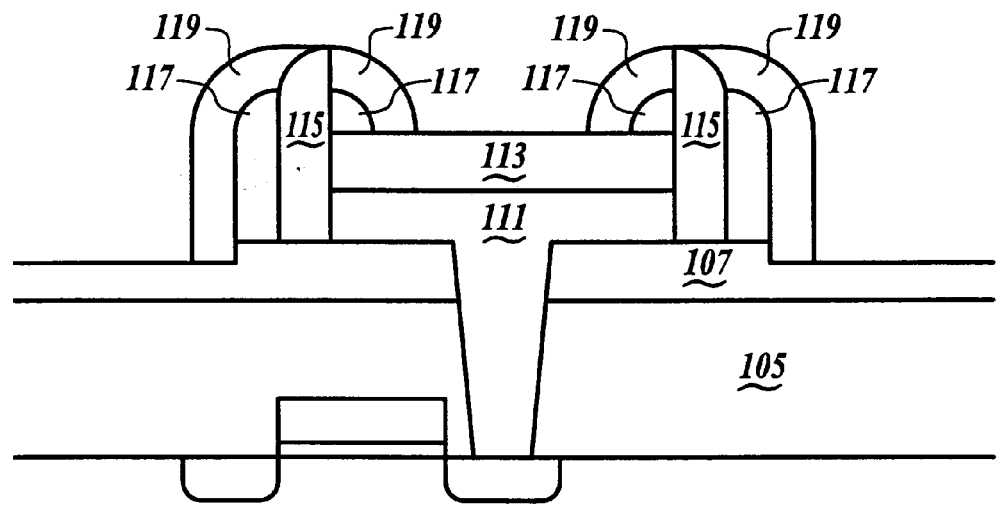

Next, turning to FIG. 6, a second polysilicon layer of about 500–1000 angstroms thickness is deposited. The second polysilicon layer is then conventionally anisotropically etched to form second polysilicon spacers 119 on the sidewalls of the nitride spacers 117. The etching should preferably be performed until the tops of the first polysilicon spacers 115 are reached. This allows a conductive connection to be made between the second polysilicon spacers 119 and the exposed top of the first polysilicon spacers 115.

Figure 7:
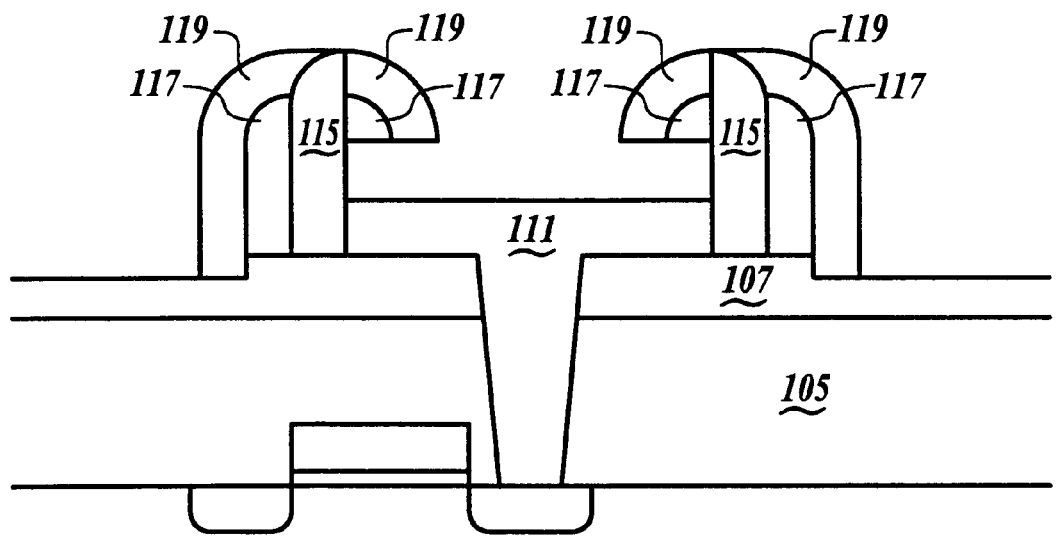

Turning to FIG. 7, the next step is to perform a wet dip oxide etch of the oxide layer 113. This can preferably be performed using a dilute HF solution or a buffered oxide etch. Note that the nitride layer 107 acts as an etching barrier layer for the ILD 105.

Figure 8:
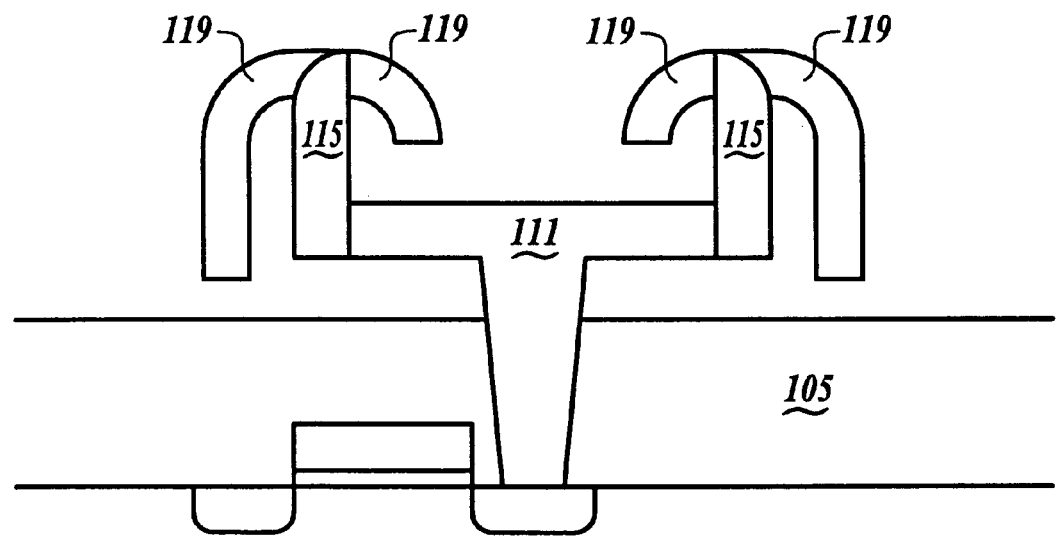

Next, turning to FIG. 8, a wet dip nitride etch of the nitride layer 107 and nitride spacers 117 is performed. This can preferably be performed using a hot $H_3PO_4$ solution. The resulting structure is shown in FIG. 8, which is the bottom storage node of a DRAM capacitor. The bottom storage node is generally of crown shape with mushroom shaped overhangs (the second polysilicon spacers 119). Further, although shown only in cross section, it can be appreciated by those skilled in the art that the bottom storage node is preferably of cylindrical shape and that the second polysilicon spacers 119 form a half toroidal shape.

Figure 9:
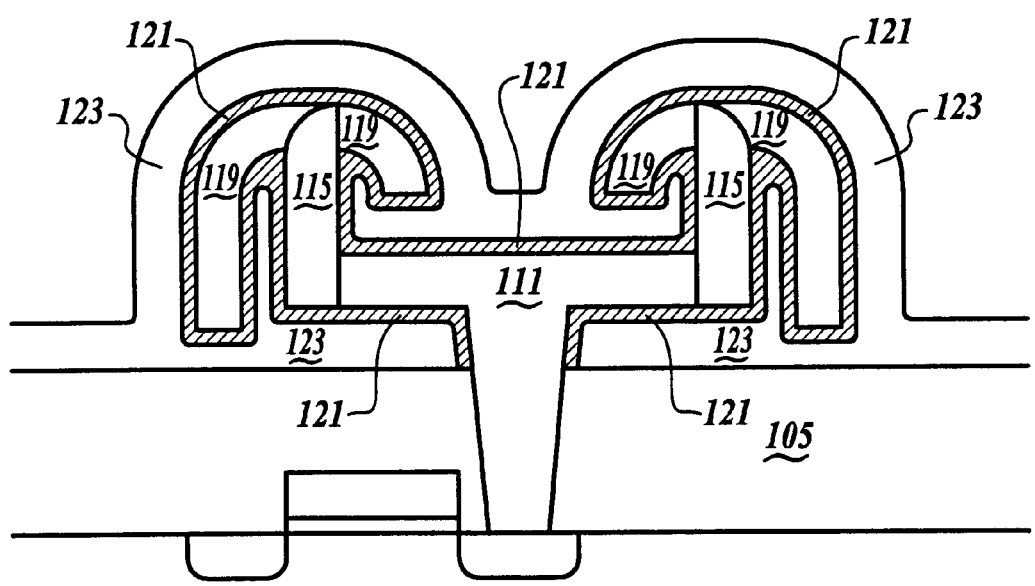

Finally, to complete the capacitor, turning to FIG. 9, any conventional capacitor dielectric 121 (such as oxide/nitride/oxide) is deposited and a final top layer of in-situ doped polysilicon 123 is deposited.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A method of forming a capacitor for a DRAM memory cell, the method comprising the steps of:
   forming an interlayer dielectric;
   forming a nitride layer over said interlayer dielectric layer;
   forming a contact hole in said nitride layer and said interlayer dielectric;
   forming a first polysilicon layer in said contact hole and over said nitride layer;
   forming an oxide layer over said first polysilicon layer, patterning and etching said oxide layer and said first polysilicon layer to form an intermediate structure over said contact hole;
   forming first polysilicon spacers on the sides of said intermediate structure;
   removing a portion of said oxide layer of said intermediate structure so that the tops of said first polysilicon spacers are exposed;
   forming nitride spacers on the sides of said first polysilicon spacers, said nitride spacers not extending to the top of said first polysilicon spacers;
   forming second polysilicon spacers on said nitride spacers and said first polysilicon spacers;
   removing said oxide layer;
   removing said nitride spacers and said nitride layer; and
   forming a dielectric layer and a top conductive layer over the bottom storage node.

2. The method of claim 1 wherein said dielectric layer is ONO.

3. The method of claim 1 wherein said first and second polysilicon spacers and said first polysilicon layer are in-situ doped polysilicon.

4. The method of claim 1 wherein said oxide layer is formed from TEOS or BPSG and having a thickness of between 4000–6000 angstroms.

5. The method of claim 1 wherein said nitride layer is between 1500–2000 angstroms thick.

6. The method of claim 1 wherein said step of removing a portion of said oxide layer leaves a remaining oxide layer having a thickness in the range of 1000–2000 angstroms.

7. The method of claim 1 wherein said nitride layer and said nitride spacers are formed from $Si_3N_4$.

8. A method of making a bottom storage node in a contact hole, said contact hole formed in an interlayer dielectric and a nitride layer, the method comprising the steps of:
   forming a first polysilicon layer in said contact hole and over said nitride layer;
   forming an oxide layer over said first polysilicon layer, patterning and etching said oxide layer and said first polysilicon layer to form an intermediate structure over said contact hole;
   forming first polysilicon spacers on the sides of said intermediate structure;
   removing a portion of said oxide layer of said intermediate structure so that the tops of said first polysilicon spacers are exposed;
   forming nitride spacers on the sides of said first polysilicon spacers, said nitride spacers not extending to the top of said first polysilicon spacers;
   forming second polysilicon spacers on said nitride spacers and said first polysilicon spacers;
   removing said oxide layer; and
   removing said nitride spacers and said nitride layer.

9. The method of claim 8 wherein said oxide layer is TEOS having a thickness between 4000–6000 angstroms.

10. The method of claim 8 wherein said oxide layer has a thickness of between 4000–6000 angstroms.

11. The method of claim 8 wherein said nitride layer is between 1500–2000 angstroms thick.

12. The method of claim 8 wherein said step of removing a portion of said oxide layer leaves a remaining oxide layer having a thickness in the range of 1000–2000 angstroms.

13. The method of claim 8 wherein said nitride layer and said nitride spacers are formed from $Si_3N_4$.

14. A method of making a bottom storage node over a contact hole, said contact hole formed in an interlayer dielectric and a nitride layer, the method comprising the steps of:
   forming a crown shaped polysilicon structure over said contact hole, said crown shaped polysilicon structure having an oxide layer filling a portion of the inside of said crown shaped polysilicon structure;
   forming nitride spacers on the inner and outer sides of said crown shaped polysilicon structure, said nitride spacers not extending to the top of said crown shaped polysilicon structure;
   forming second polysilicon spacers on said nitride spacers and said crown shaped polysilicon structure;
   removing said oxide layer; and
   removing said nitride spacers and said nitride layer.

15. The method of claim 14 wherein said nitride layer is between 1500–2000 angstroms thick.

16. The method of claim 14 wherein said oxide layer has a thickness in the range of 1000–2000 angstroms.

17. The method of claim 14 wherein said nitride layer and said nitride spacers are formed from $Si_3N_4$.

* * * * *